(12) United States Patent
Fujino et al.

(10) Patent No.: US 9,608,230 B2
(45) Date of Patent: Mar. 28, 2017

(54) ORGANIC ELECTROLUMINESCENT DEVICE AND MANUFACTURING METHOD THEREOF, AND DISPLAY DEVICE

(71) Applicant: BOE Technology Group Co., Ltd., Beijing (CN)

(72) Inventors: Seiji Fujino, Beijing (CN); Guodong Huang, Beijing (CN); Qinghui Zeng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 14/786,036

(22) PCT Filed: Feb. 13, 2015

(86) PCT No.: PCT/CN2015/073014
§ 371 (c)(1),
(2) Date: Oct. 21, 2015

(87) PCT Pub. No.: WO2016/082354
PCT Pub. Date: Jun. 2, 2016

(65) Prior Publication Data
US 2016/0218315 A1 Jul. 28, 2016

(30) Foreign Application Priority Data

Nov. 27, 2014 (CN) .......................... 2014 1 0708765

(51) Int. Cl.
*H01L 51/00* (2006.01)
*H01L 21/00* (2006.01)
(Continued)

(52) U.S. Cl.
CPC ...... *H01L 51/5237* (2013.01); *H01L 27/3276* (2013.01); *H01L 27/3288* (2013.01);
(Continued)

(58) Field of Classification Search
CPC ............ H01L 51/5237; H01L 51/0035; H01L 51/0097; H01L 51/52; H01L 51/5256; H01L 51/56; H01L 27/3276; H01L 27/3288
(Continued)

(56) References Cited

U.S. PATENT DOCUMENTS

2004/0232418 A1 11/2004 Koyama et al.
2014/0110688 A1* 4/2014 Nakamura .......... H01L 51/5284
257/40
(Continued)

FOREIGN PATENT DOCUMENTS

CN 102082163 A 6/2011
CN 103268883 A 8/2013
(Continued)

OTHER PUBLICATIONS

Jul. 20, 2015—International Search Report Appn PCT/CN2015/073014 with Eng Tran of Written Opinion.
(Continued)

*Primary Examiner* — Kevin M Picardat
(74) *Attorney, Agent, or Firm* — Banner & Witcoff, Ltd.

(57) ABSTRACT

An organic electroluminescent device and a manufacturing method thereof, and a display device. The organic electroluminescent device comprises comprising a base substrate, a packaging structure, an organic electroluminescent structure located between the base substrate and the packaging structure, and a flexible printed circuit board; the base substrate being provided with a peripheral wiring structure electrically connected with an internal wiring of the organic electroluminescent structure; the peripheral wiring structure including a welding part. The welding part has a first surface facing the base substrate, at least a portion of the first surface being
(Continued)

exposed to electrically connect with a welding terminal of the flexible printed circuit board.

17 Claims, 5 Drawing Sheets

(51) Int. Cl.
*H01L 51/52* (2006.01)
*H01L 51/56* (2006.01)
*H01L 27/32* (2006.01)

(52) U.S. Cl.
CPC ...... *H01L 51/0035* (2013.01); *H01L 51/0097* (2013.01); *H01L 51/52* (2013.01); *H01L 51/5256* (2013.01); *H01L 51/56* (2013.01); *H01L 2251/5338* (2013.01)

(58) Field of Classification Search
USPC ............. 257/40, 99, 100; 438/26, 27, 28, 29
See application file for complete search history.

(56) References Cited

U.S. PATENT DOCUMENTS

| | | | |
|---|---|---|---|
| 2014/0273317 A1 | 9/2014 | Chida | |
| 2015/0060778 A1* | 3/2015 | Kim | H01L 27/3258 257/40 |
| 2015/0144904 A1* | 5/2015 | Jeong | H01L 27/326 257/40 |
| 2015/0255758 A1* | 9/2015 | Hirai | H01L 51/5246 438/28 |

FOREIGN PATENT DOCUMENTS

| | | |
|---|---|---|
| CN | 103594485 A | 2/2014 |
| CN | 103681735 A | 3/2014 |

OTHER PUBLICATIONS

Jun. 2, 2016—(CN)—First Office Action Appn 201410708765.0 with English Tran.

* cited by examiner

US 9,608,230 B2

ORGANIC ELECTROLUMINESCENT DEVICE AND MANUFACTURING METHOD THEREOF, AND DISPLAY DEVICE

The application is a U.S. National Phase Entry of International Application No. PCT/CN2015/073014 filed on Feb. 13, 2015, designation the United States of America and claiming priority to Chinese Patent Application No. 201410708765.0 filed on Nov. 27, 2014. The present application claims priority to and the benefit of the above-identified applications and the above-identified applications are incorporated by reference herein in their entirety.

TECHNICAL FIELD

Embodiments of the present disclosure relate to an organic electroluminescent device and a manufacturing method thereof, and a display device.

BACKGROUND

In a display technical field, an organic electroluminescent device is an important structure to realize flexible display.

Same as other display devices, a narrow bezel design of the organic electroluminescent device is also an important research direction for those skilled in the art.

In a related art, as shown in FIG. 1 and FIG. 2, an organic electroluminescent device comprises a base substrate 01, a buffer layer 02, a thin film transistor TFT switch wiring located in an effective display region, a peripheral wiring structure located in a non-display region, an organic electroluminescent structure 04 formed in the effective display region, a packaging substrate 06, an anti-oxidation structure 05 formed between the packaging substrate 06 and the organic electroluminescent structure 04; the peripheral wiring structure has a peripheral wiring 031, a welding part 032, a connecting circuit wiring 033 for connecting the welding part 032 and the peripheral wiring 031. A welding terminal 08 of a flexible printed circuit board 07 is welded on the welding part 032, to realize electrical connection between the flexible printed circuit board 07 and the peripheral wiring 031.

However, in the related art, because the welding terminal 08 of the flexible printed circuit board 07 is welded on a side of the welding part 032 away from the base substrate 01, it is necessary to bend the flexible printed circuit board 07 to the side of the base substrate 01 away from the packaging substrate 06, so that a bending width for the flexible printed circuit board 07 needs to be reserved on the side of the organic electroluminescent device corresponding to the flexible printed circuit board 07, i.e., the width D as shown in FIG. 1. Therefore, the resulted organic electroluminescent device may have a relatively wide bezel.

SUMMARY

An embodiment of the present disclosure provides an organic electroluminescent device, comprising a base substrate, a packaging structure, an organic electroluminescent structure located between the base substrate and the packaging structure, and a flexible printed circuit board; the base substrate being provided with a peripheral wiring structure electrically connected with an internal wiring of the organic electroluminescent structure; the peripheral wiring structure including a welding part, wherein the welding part has a first surface facing the base substrate, at least a portion of the first surface being exposed to electrically connect with a welding terminal of the flexible printed circuit board.

Another embodiment of the present disclosure provides a display device, comprising the organic electroluminescent device described above.

Yet another embodiment of the present disclosure provides a manufacturing method of the organic electroluminescent device described above, comprising:

forming a peripheral wiring structure and an organic electroluminescent structure on a base substrate, packaging and assembling a packaging structure and the base substrate, wherein the peripheral wiring structure has a welding part;

forming a concave part which is opened on a surface of the base substrate away from the organic electroluminescent structure to expose the welding part;

inserting a welding terminal of a flexible printed circuit board into the concave part, and welding the welding terminal of the flexible printed circuit board onto the welding part.

BRIEF DESCRIPTION OF THE DRAWINGS

In order to clearly illustrate the technical solution of the embodiments of the disclosure, the drawings of the embodiments or used in descriptions of related technologies will be briefly described in the following; it is obvious that the described drawings are only related to some embodiments of the disclosure and thus are not limitative of the disclosure.

FIG. 4b is a distribution schematic diagram of wirings in a second wiring layer of the organic electroluminescent device having the structure shown in FIG. 4a;

FIG. 4c is a distribution schematic diagram of wirings in a first wiring layer of the organic electroluminescent device having the structure shown in FIG. 4a;

FIG. 5b is a distribution schematic diagram of wirings in a second wiring layer of the organic electroluminescent device having the structure shown in FIG. 5a;

FIG. 5c is a distribution schematic diagram of wirings in a first wiring layer of the organic electroluminescent device having the structure shown in FIG. 5a;

FIG. 6b is a distribution schematic diagram of wirings in a fifth wiring layer of the organic electroluminescent device having the structure shown in FIG. 6a;

FIG. 6c is a distribution schematic diagram of wirings in a fourth wiring layer of the organic electroluminescent device having the structure shown in FIG. 6a;

FIG. 6d is a distribution schematic diagram of wirings in a third wiring layer of the organic electroluminescent device having the structure shown in FIG. 6a.

DETAILED DESCRIPTION

Hereinafter, the technical solutions of the embodiments of the present disclosure will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide an organic electroluminescent device and a manufacturing method thereof, and a display device. No bending space for a flexible printed circuit board is needed in a bezel of the organic electroluminescent device, so that a width of the bezel of the organic electroluminescent device can be reduced.

Figure 1:
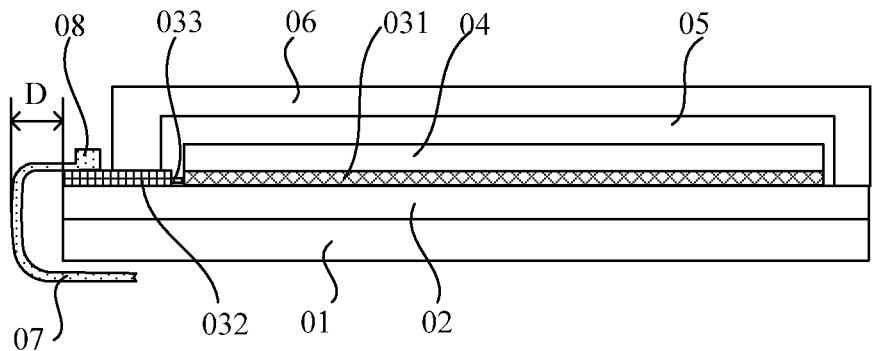
FIG. 1 is a structural schematic diagram of an organic electroluminescent device in a related art.
Figure 2:
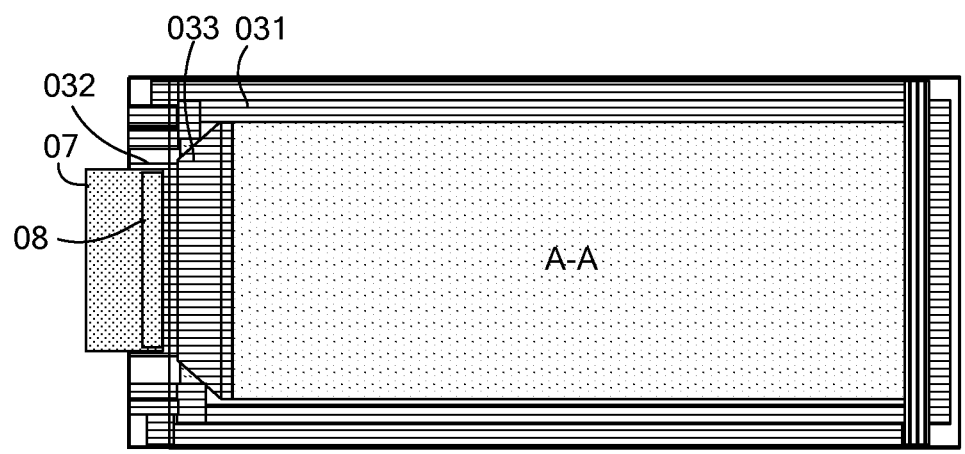
FIG. 2 is a distribution schematic diagram of a peripheral wiring structure and a flexible printed circuit board in the organic electroluminescent device having a structure shown in FIG. 1.
Figure 3:
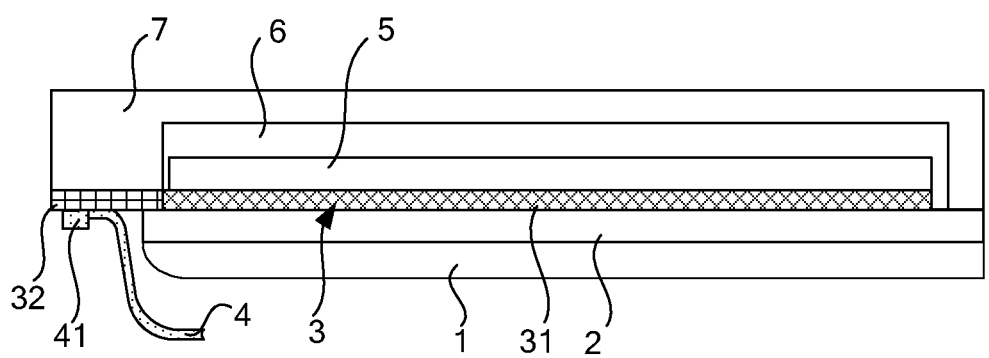
FIG. 3 is a structural schematic diagram of an organic electroluminescent device provided by Embodiment I of the present disclosure.

As shown in FIG. 3, an organic electroluminescent device provided by Embodiment I of the present disclosure comprises a base substrate 1, a packaging structure 7, an organic electroluminescent structure 5 located between the base substrate 1 and the packaging structure 7, and a flexible printed circuit board FPC 4. The base substrate 1 is provided with a peripheral wiring structure 3 electrically connected with an internal wiring of the organic electroluminescent structure 5. The peripheral wiring structure 3 includes a welding part 32. The base substrate 1 is provided with a concave part. The concave part is opened on a surface of the base substrate 1 away from the organic electroluminescent structure 5 to expose the welding part 32. A welding terminal 41 of the FPC 4 is located within the concave part and welded on the welding part 32.

In the organic electroluminescent device described above, the base substrate 1 is provided with a concave part which is opened on the surface of the base substrate 1 away from the organic electroluminescent structure 5 to expose the welding part 32. The welding terminal 41 of the flexible printed circuit board 4 directly is inserted into the concave part from a side of the base substrate 1 away from the organic electroluminescent structure 5, and is welded onto the welding part 32, to realize electrical connection between the flexible printed circuit board 4 and the peripheral wiring structure 3. Because the flexible printed circuit board 4 is not needed to be bended from a side of the welding part 32 away from the base substrate 1 to a side of the base substrate 1 away from the organic electroluminescent structure 5, a bending space for the flexible printed circuit board 4 does not need to be reserved in a bezel of the organic electroluminescent device, so that the width of the bezel of the organic electroluminescent device can be reduced.

Further refer to FIG. 3, in an example, the packaging structure 7 described above can be a packaging substrate. A buffer layer 2 is arranged between the base substrate 1 and the peripheral wiring structure 3. A chamber 6 is formed between the organic electroluminescent structure 5 and the packaging structure 7. Nitrogen, inert gas, resin or desiccant can be filled into the chamber 6 so as to improve barrier property to water, oxygen and so on.

Of course, the base substrate 1 can be a flexible base substrate, and meanwhile the packaging structure 7 is a flexible packaging film, so that the resulted organic electroluminescent device is a flexible display device. Herein, the base substrate can be a PI film of a carrying board structure, and the packaging structure 7 can be a packaging film formed by organic thin films and inorganic thin films alternatively overlapping with each other.

In an example, the peripheral wiring structure 3 further includes a peripheral wiring 31 which is directly electrically connected with the internal wiring of the organic electroluminescent structure 5, and a diffusion circuit wiring for connecting the welding part 32 and the peripheral wiring 31.

Figure 4A:
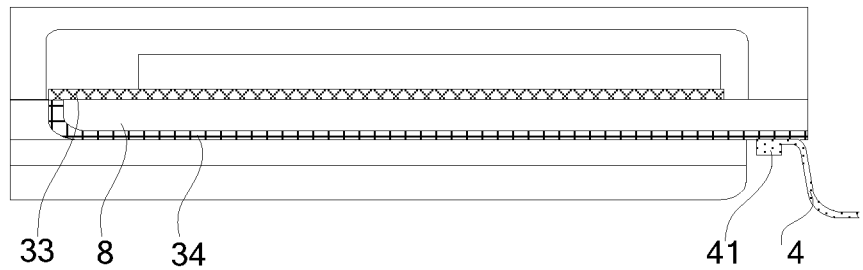
FIG. 4a is a structural schematic diagram of an organic electroluminescent device provided by Embodiment II of the present disclosure.
Figure 4B:
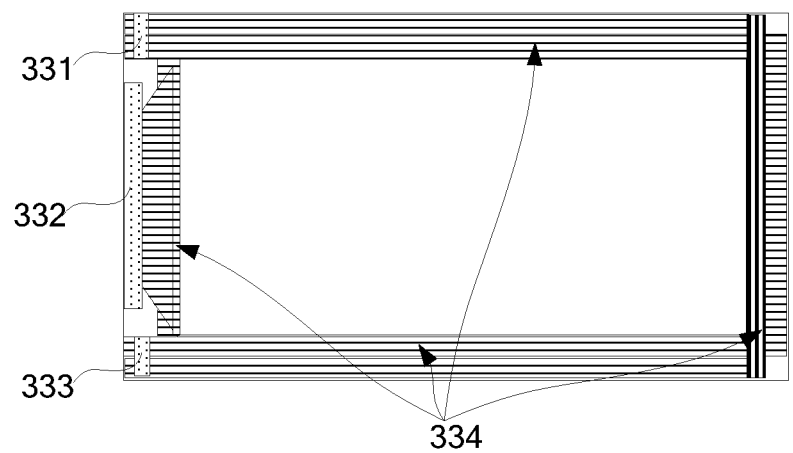
Figure 4C:
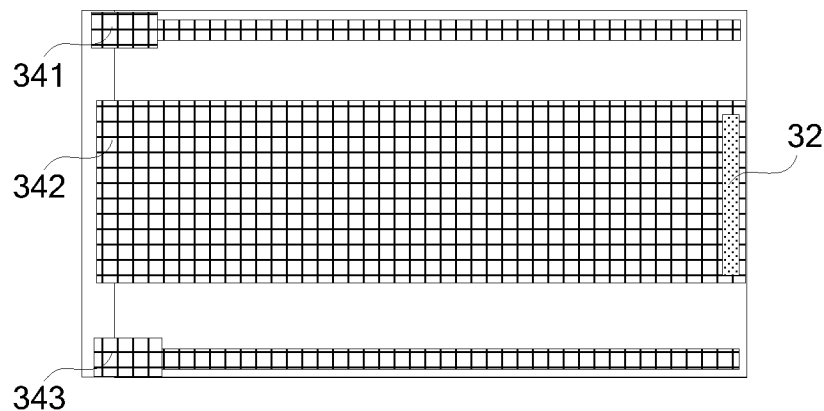

Embodiment II of the present disclosure provides an organic electroluminescent device, as shown in FIG. 4a to FIG. 4c. FIG. 4a is a structural schematic diagram of an organic electroluminescent device provided by Embodiment II of the present disclosure; FIG. 4b is a distribution schematic diagram of wirings in a second wiring layer of the organic electroluminescent device having the structure shown in FIG. 4a; and FIG. 4c is a distribution schematic diagram of wirings in a first wiring layer of the organic electroluminescent device having the structure shown in FIG. 4a. In the organic electroluminescent device provided by Embodiment II of the present disclosure, a base substrate 1, a packaging structure 7, an organic electroluminescent structure 5 located between the base substrate 1 and the packaging structure 7, and a flexible printed circuit board FPC 4 are arranged in a way similar to Embodiment I, and related description thereof is omitted herein. Hereinafter, differences between the organic electroluminescent device provided by Embodiment II and the organic electroluminescent device provided by Embodiment I are described in detail.

As shown in FIG. 4a, in the organic electroluminescent device provided by Embodiment II of the present disclosure, the peripheral wiring structure 3 is arranged in two layers, that is, a first wiring layer 34 and a second wiring layer 33. Herein, the first wiring layer 34 is located between the second wiring layer 33 and the base substrate 1, and an insulating layer 8 is arranged between the first wiring layer 34 and the second wiring layer 33. As shown in FIG. 4c, the welding part 32, the diffusion circuit wiring and a first portion of the peripheral wiring are formed on the first wiring layer 34; a second portion of the peripheral wiring and a contact part are arranged on the second wiring layer 33. The portion of the peripheral wiring structure 3 arranged on the first wiring layer 34 and the portion of the peripheral wiring structure 3 arranged on the second wiring layer 33 are electrically connected through the contact part. As shown in FIG. 4b, the contact part includes a contact part 331, a contact part 332 and a contact part 333. The first portion of the peripheral wiring includes peripheral wirings 341, 342 and 343; the second portion of the peripheral wiring includes a peripheral wiring 334. The contact part 331 in the second wiring layer 33 is electrically connected with the wiring 341 in the first wiring layer 34; the contact part 332 in the second wiring layer 33 is electrically connected with the wiring 342 in the first wiring layer 34; and the contact part 333 in the second wiring layer 33 is electrically connected with the wiring 343 in the first wiring layer 34. An electric signal from the flexible printed circuit board 4 is transmitted to the peripheral wiring 334 in the second wiring layer 33 through the welding part 32.

In Embodiment II, because the welding part 32 of the peripheral wiring structure 3 of the organic electroluminescent device is arranged within the first wiring layer 34, a bezel width of the organic electroluminescent device occupied by the welding part 32 is further reduced, thus facilitating further reducing the bezel width of the organic electroluminescent device.

The organic electroluminescent device provided by Embodiment II of the present disclosure can be fabricated by the following method. Firstly, a buffer layer 2 made of an insulating material is fainted on the base substrate 1; a peripheral wiring structure 3 and an organic electroluminescent structure 5 are formed on the buffer layer 2; then, a packaging structure 7 and the base substrate 1 are assembled and packaged; and then, a surface of the base substrate 1 away from the organic electroluminescent structure 5 is processed by using a laser process to form a concave part, and, the welding terminal 41 of the flexible printed circuit board 4 is welded onto the welding part 32 of the peripheral wiring structure 3.

In the organic electroluminescent device provided by Embodiment II of the present disclosure, the welding part 32 can be located in middle of the first wiring layer 34.

Figure 5A:
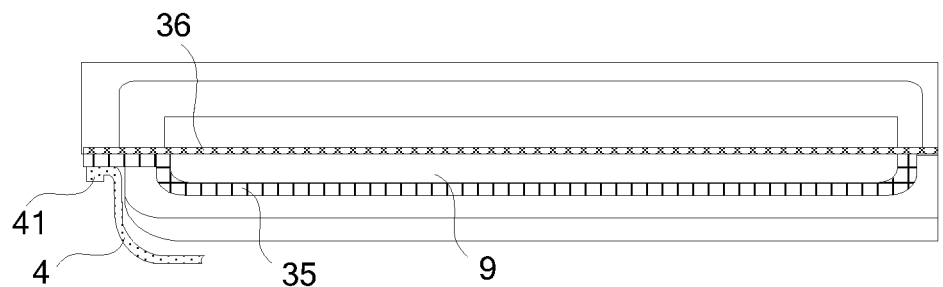
FIG. 5a is a structural schematic diagram of an organic electroluminescent device provided by Embodiment III of the present disclosure.
Figure 5B:
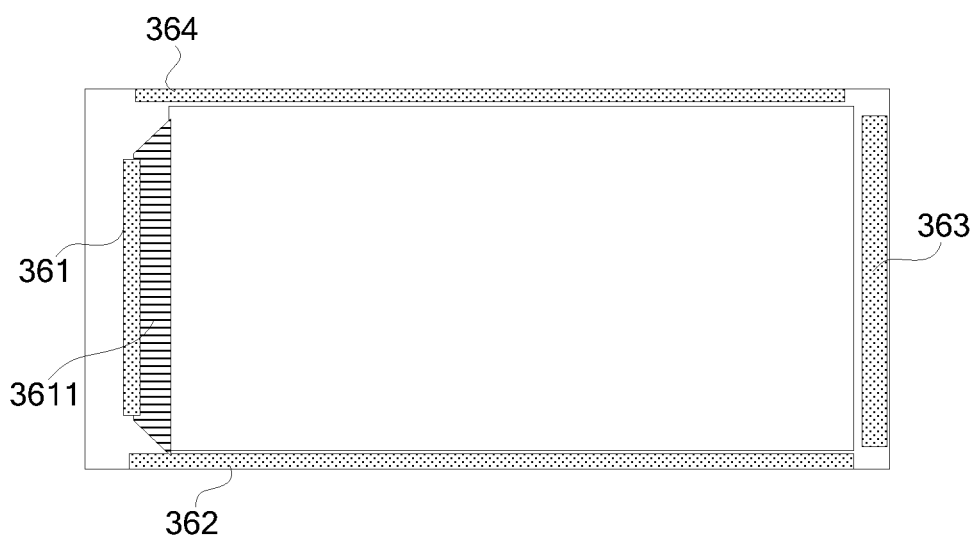
Figure 5C:
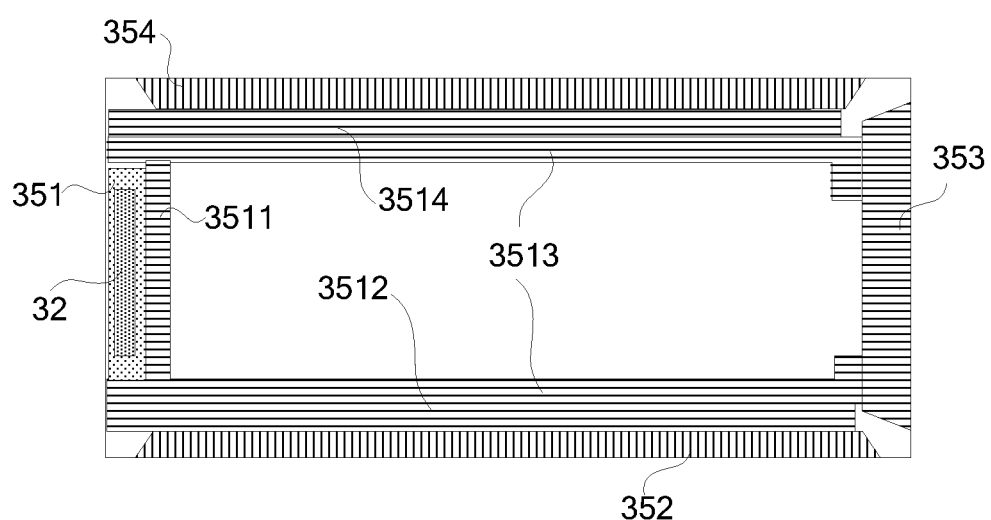

Embodiment III of the present disclosure provides an organic electroluminescent device, as shown in FIG. 5a to FIG. 5c. FIG. 5a is a structural schematic diagram of the organic electroluminescent device provided by Embodiment III of the present disclosure; FIG. 5b is a distribution schematic diagram of wirings in a second wiring layer of the organic electroluminescent device having the structure shown in FIG. 5a; and FIG. 5c is a distribution schematic diagram of wirings in a first wiring layer of the organic electroluminescent device having the structure shown in FIG. 5a. In the organic electroluminescent device provided by Embodiment III of the present disclosure, the base substrate 1, the packaging structure 7, the organic electroluminescent structure 5 located between the base substrate 1 and the packaging structure 7, and the flexible printed circuit board FPC 4 are arranged in a way similar to Embodiment I, and related description thereof is omitted herein. Hereinafter, differences between the organic electroluminescent device provided by Embodiment III and the organic electroluminescent device provided by Embodiment I are described in detail.

As shown in FIG. 5a, in the organic electroluminescent device provided by Embodiment III of the present disclosure, the peripheral wiring structure 3 is arranged in two layers that is, a first wiring layer 35 and a second wiring layer 36, wherein, the first wiring layer 35 is located between the second wiring layer 36 and the base substrate 1;

As shown in FIG. 5c, the welding part 32 is formed within the first wiring layer 35. A contact part is provided in the second wiring layer 36, and the portion of the peripheral wiring structure in the first wiring layer 35 and the portion of the peripheral wiring structure in the second wiring layer 36 are electrically connected through the contact part. In the peripheral wiring structure 3, as shown in FIG. 5c, the diffusion circuit wiring is arranged in the first wiring layer 35, and at least a portion of the peripheral wiring is arranged in the first wiring layer 35; as shown in FIG. 5b, the contact part arranged in the second wiring layer 36 includes a contact part which is electrically connected with a first portion of the peripheral wiring arranged in the first wiring layer, and is electrically connected with an internal wiring of the organic electroluminescent structure.

For example, the diffusion circuit wiring, as shown in FIG. 5c, includes a diffusion circuit wiring 3511, a diffusion circuit wiring 3512, a diffusion circuit wiring 3513, and a diffusion circuit wiring 3514. As shown in FIG. 5c, the first portion of the peripheral wiring arranged in the first wiring layer 35 includes a peripheral wiring 352, a peripheral wiring 353 and a peripheral wiring 354. As shown in FIG. 5b, the contact part arranged in the second wiring layer 36 includes a contact part 361, a contact part 362, a contact part 363 and a contact part 364. A second portion 3611 of the peripheral wiring is arranged in the second wiring layer 36. The welding part 32, for example, is provided with an integrated circuit 351.

The diffusion circuit wiring 3511 is electrically connected with the integrated circuit 351 provided for the welding part 32, and is electrically connected with the contact part 361; the contact part 361 is electrically connected with the peripheral wiring 3611 arranged in the second wiring layer 36, to realize electrically connecting with the internal wiring of the organic electroluminescent structure 5;

The diffusion circuit wiring 3512 is electrically connected with the integrated circuit 351 provided for the welding part 32, and is electrically connected with the peripheral wiring 352; the peripheral wiring 352 is electrically connected with the contact part 362 arranged in the second wiring layer 36, to realize electrical connection with the internal wiring of the organic electroluminescent structure 5;

The diffusion circuit wiring 3513 is electrically connected with the integrated circuit 351 provided for the welding part 32, and is electrically connected with the peripheral wiring 353; the peripheral wiring 353 is electrically connected with the contact part 363 arranged in the second wiring layer 36, to realize electrical connection with the internal wiring of the organic electroluminescent structure 5;

The diffusion circuit wiring 3514 is electrically connected with the integrated circuit 351 provided for the welding part 32, and is electrically connected with the peripheral wiring 354; the peripheral wiring 354 is electrically connected with the contact part 364 arranged in the second wiring layer 36, to realize electrical connection with the internal wiring of the organic electroluminescent structure 5.

In the organic electroluminescent device provided by the embodiment described above, the diffusion circuit wiring and at least a portion of the peripheral wiring are arranged in the first wiring layer 35, so that the diffusion circuit wiring and the peripheral wiring arranged on the first wiring layer 35 do not occupy an area surrounding the effective display region of the organic electroluminescent device, thus further reducing the width of corresponding bezel of the organic electroluminescent device.

For example, as shown in FIG. 5a, an insulating layer 9 is arranged between the first wiring layer 35 and the second wiring layer 36. The insulating layer 9 is provided with a via hole region corresponding to the contact part arranged in the second wiring layer 36. The portion of the peripheral wiring structure arranged in the first wiring layer 35 and corresponding to the contact part pass through the insulating layer 9 through the via hole region of the insulating layer to connect with the contact part.

In the organic electroluminescent device provided by Embodiment III of the present disclosure, the welding part 32 can be located in middle of the first wiring layer 35.

Figure 6A:
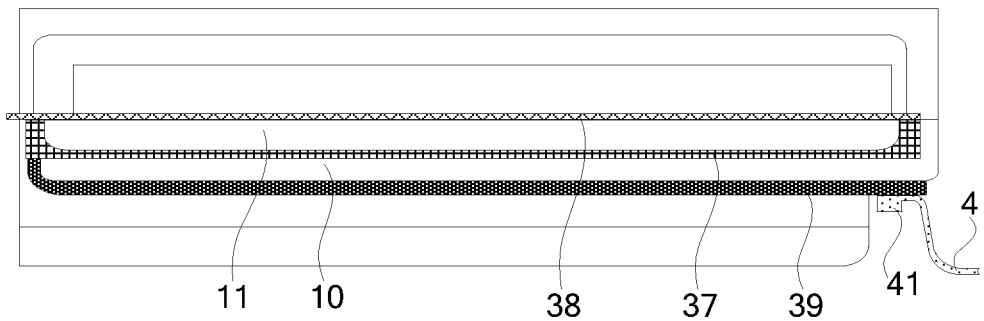
FIG. 6a is a structural schematic diagram of an organic electroluminescent device provided by Embodiment IV of the present disclosure.
Figure 6B:
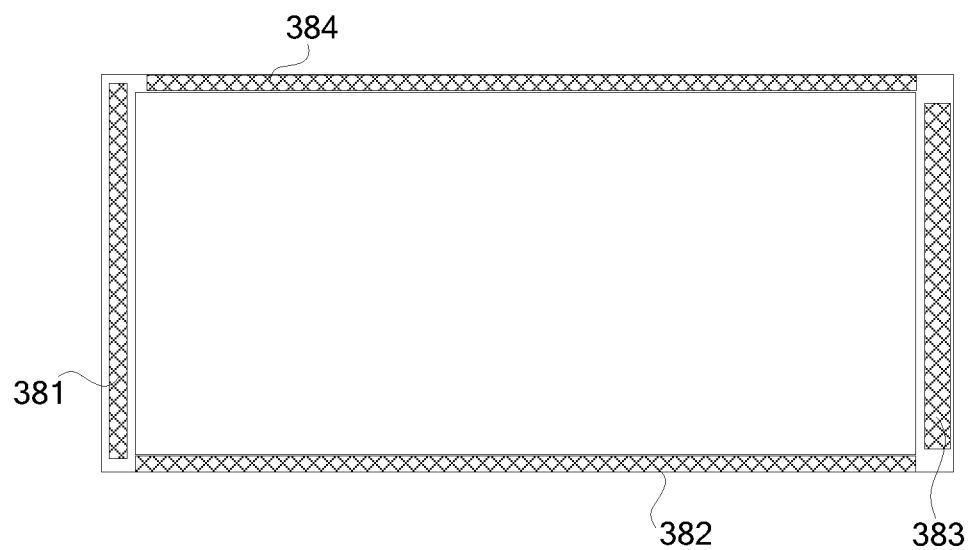
Figure 6C:
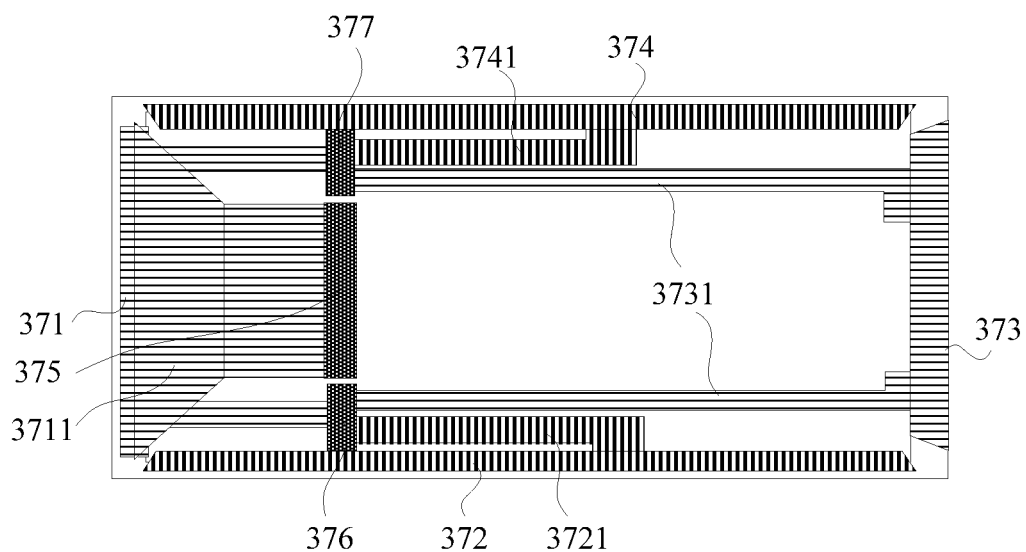
Figure 6D:
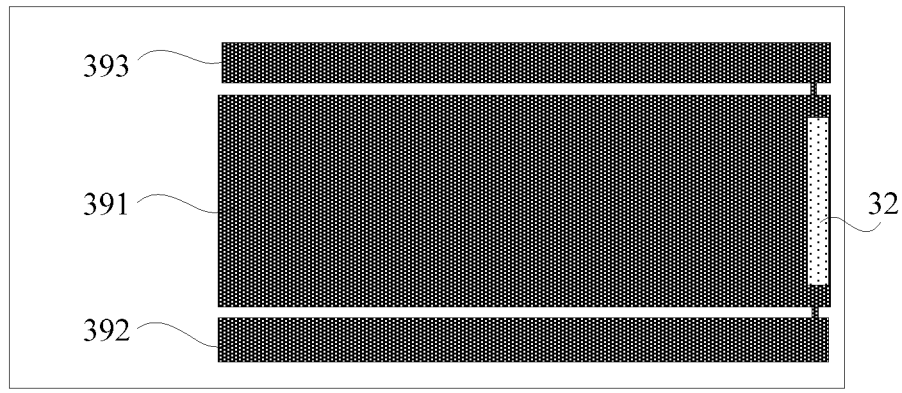

Embodiment IV of the present disclosure provides an organic electroluminescent device, as shown in FIG. 6a to FIG. 6d. FIG. 6a is a structural schematic diagram of an organic electroluminescent device provided by Embodiment IV of the present disclosure; FIG. 6b is a distribution schematic diagram of wirings in a fifth wiring layer of the organic electroluminescent device having the structure shown in FIG. 6a; FIG. 6c is a distribution schematic diagram of wirings in a fourth wiring layer of the organic electroluminescent device having the structure shown in FIG. 6a; and FIG. 6d is a distribution schematic diagram of wirings in a third wiring layer of the organic electroluminescent device having the structure shown in FIG. 6a. In the organic electroluminescent device provided by Embodiment IV of the present disclosure, the base substrate 1, the packaging structure 7, the organic electroluminescent structure 5 located between the base substrate 1 and the packaging structure 7, and the flexible printed circuit board FPC 4 are arranged in a way similar to Embodiment I, and related description thereof is omitted herein. Hereinafter, differences between the organic electroluminescent device provided by Embodiment IV and the organic electroluminescent device provided by Embodiment I are described in detail.

In the organic electroluminescent device provided by this embodiment, the peripheral wiring structure 3 is arranged in three layers, that is, a third wiring layer 39, a fourth wiring layer 37 and a fifth wiring layer 38, which are sequentially arranged in a direction from the base substrate 1 to the organic electroluminescent structure 5, wherein, As shown in FIG. 6d, the welding part 32 is arranged in the third wiring layer 39;

As shown in FIG. 6c, the diffusion circuit wiring and the peripheral wiring are arranged on the fourth wiring layer 37, and a contact part for electrically connecting with the third wiring layer 39 is further provided in the fourth wiring layer 37; as shown in FIG. 6c, in the fourth wiring layer 37, a diffusion circuit wiring 3711, a diffusion circuit wiring 3721, a diffusion circuit wiring 3731, a diffusion circuit wiring 3741, a peripheral wiring 371, a peripheral wiring 372, a peripheral wiring 373, a peripheral wiring 374, a contact part 375, a contact part 376 and a contact part 377 are provided, wherein, the contact part 375 is configured for connecting with the wiring 391 in the third wiring layer 39, the contact part 376 is configured for connecting with the wiring 392 in the third wiring layer 39, and the contact part 377 is configured for connecting with the wiring 393 in the third wiring layer 39;

As shown in FIG. 6b, in the fifth wiring layer 38, a contact part electrically connected with the peripheral wiring and the internal wiring of the organic electroluminescent structure 5 is provided; the contact part, as shown in FIG. 6b, includes a contact part 381, a contact part 382, a contact part 383 and a contact part 384.

In the organic electroluminescent device having the structure described as above, the diffusion circuit wiring, the peripheral wiring and the welding part in the peripheral wiring structure 3 are all arranged between the organic electroluminescent structure 5 and the base substrate 1. Therefore, the diffusion circuit wiring, the peripheral wiring and the welding part in the peripheral wiring structure 3 do not occupy an area surrounding the effective display region, thus further reducing the width of the bezel of the organic electroluminescent device.

For example, as shown in FIG. 6a, in the peripheral wiring structure 3 of the organic electroluminescent device provided by Embodiment IV:

An insulating layer 10 is arranged between the third wiring layer 39 and the fourth wiring layer 37. The portion of the peripheral wiring structure arranged in the third wiring layer 39 and corresponding to the contact part arranged in the fourth wiring layer 37 pass through the insulating layer 10 to electrically connect with the contact part arranged in the fourth wiring layer 37;

An insulating layer 11 is arranged between the fourth wiring layer 37 and the fifth wiring layer 38. The portion of the peripheral wiring structure arranged In the fourth wiring layer 37 corresponding to the contact part arranged in the fifth wiring layer 38 pass through the insulating layer 11 to electrically connect with the contact part arranged in the fifth wiring layer 38.

In the organic electroluminescent device provided by Embodiment IV of the present disclosure, the welding part 32 can be located in middle of the third wiring layer 39.

An embodiment of the present disclosure further provides a display device. The display device comprises the organic electroluminescent device provided by any one of the embodiments described above.

Another embodiment of the present disclosure further provides a manufacturing method of the organic electroluminescent device provided by any one of the embodiments described above, comprising:

forming a peripheral wiring structure and an organic electroluminescent structure on a base substrate; packaging and assembling a packaging structure and the base substrate, wherein the peripheral wiring structure has a welding part;

forming a concave part which is opened on a surface of the base substrate away from the organic electroluminescent structure to expose the welding part;

inserting a welding terminal of a flexible printed circuit board into the concave part, and welding the welding terminal of the flexible printed circuit board onto the welding part.

In an example, before the forming the peripheral wiring structure and the organic electroluminescent structure on the base substrate, and packaging and assembling the packaging structure and the base substrate, the method further comprises:

coating a PI liquid on a glass substrate;

baking the glass substrate coated with the PI liquid to form a base substrate.

Before the forming the concave part which is opened on the surface of the base substrate away from the organic electroluminescent structure to expose the welding part, the method further comprises:

the structure obtained by forming the peripheral wiring structure and the organic electroluminescent structure on the base substrate, and packaging and assembling the packaging structure and the base substrate, is separated from the glass substrate.

According to above description, the embodiments of the present disclosure at least can provide structures and methods of:

(1) An organic electroluminescent device, comprising a base substrate, a packaging structure, an organic electroluminescent structure located between the base substrate and the packaging structure, and a flexible printed circuit board; the base substrate being provided with a peripheral wiring structure electrically connected with an internal wiring of the organic electroluminescent structure; the peripheral wiring structure including a welding part, wherein the welding part has a first surface facing the base substrate, at least a portion of the first surface being exposed to electrically connect with a welding terminal of the flexible printed circuit board.

(2) The organic electroluminescent device according to claim 1, wherein, the base substrate is provided with a concave part configured to expose the at least a portion of the first surface of the welding part.

(3) The organic electroluminescent device according to (1) or (2), wherein, the peripheral wiring structure further includes a peripheral wiring electrically connected with the internal wiring of the organic electroluminescent structure, and a diffusion circuit wiring for connecting the welding part and the peripheral wiring; the peripheral wiring structure is divided into a first wiring layer and a second wiring layer, the first wiring layer is located between the second wiring layer and the base substrate; and the welding part is arranged in the first wiring layer.

(4) The organic electroluminescent device according to any one of (1) to (3), wherein, the diffusion circuit wiring and at least a portion of the peripheral wiring are arranged in the first wiring layer, a contact part is arranged in the second wiring layer, the peripheral wiring structure arranged in the first wiring layer and the peripheral wiring structure arranged in the second wiring layer are electrically connected through the contact part.

(5) The organic electroluminescent device according to (4), the contact part arranged in the second wiring layer includes a contact part which is electrically connected with at least a portion of the peripheral wiring arranged in the first wiring layer and the internal wiring of the organic electroluminescent structure.

(6) The organic electroluminescent device according to any one of (3) to (5), wherein, an insulating layer is arranged between the first wiring layer and the second wiring layer, the insulating layer is provided with a via hole region corresponding to the contact part in the second wiring layer, a portion of the peripheral wiring structure arranged in the first wiring layer and corresponding to the contact part passes through the insulating layer through the via hole region so as to be electrically connected with the contact part.

(7) The organic electroluminescent device according to any one of (3) to (6), wherein, the welding part is located in middle of the first wiring layer.

(8) The organic electroluminescent device according to (1) or (2), wherein, the peripheral wiring structure further includes a peripheral wiring electrically connected with the internal wiring of the organic electroluminescent structure, and a diffusion circuit wiring for connecting the welding part and the peripheral wiring, the peripheral wiring structure is divided into a third wiring layer, a fourth wiring layer and a fifth wiring layer, which are sequentially arranged in a direction from the base substrate to the organic electroluminescent structure, wherein, the welding part is arranged in the third wiring layer;

the diffusion circuit wiring and the peripheral wiring are arranged in the fourth wiring layer, and the fourth wiring layer is provided with a contact part electrically connected with the third wiring layer;

the fifth wiring layer is provided with a contact part which is electrically connected with the peripheral wiring and the internal wiring of the organic electroluminescent structure.

(9) The organic electroluminescent device according to (8), wherein, an insulating layer is arranged between the third wiring layer and the fourth wiring layer, a portion of the peripheral wiring structure arranged in the third wiring layer and corresponding to the contact part in the fourth wiring layer passes the insulating layer so as to be electrically connected with the contact part arranged in the fourth wiring layer;

an insulating layer is arranged between the fourth wiring layer and the fifth wiring layer, a portion of the peripheral wiring structure arranged in the fourth wiring layer and corresponding to the contact part in the fifth wiring layer passes the insulating layer so as to be electrically connected with the contact part arranged in the fifth wiring layer.

(10) The organic electroluminescent device according to (8) or (9), wherein, the welding part is located in middle of the third wiring layer.

(11) The organic electroluminescent device according to any one of (1) to (10), wherein, the base substrate is a flexible base substrate and the packaging structure is a flexible packaging structure.

(12) The organic electroluminescent device according to (11), wherein, the base substrate is a PI film.

(13) The organic electroluminescent device according to (11), wherein, the packaging structure is a packaging film formed by organic thin films and inorganic thin films alternatively overlapping with each other.

(14) A display device, comprising the organic electroluminescent device according to any one of (1) to (13).

(15) A manufacturing method of the organic electroluminescent device according to any one of (1) to (13), comprising:

forming a peripheral wiring structure and an organic electroluminescent structure on a base substrate, packaging and assembling a packaging structure and the base substrate, wherein the peripheral wiring structure has a welding part;

forming a concave part which is opened on a surface of the base substrate away from the organic electroluminescent structure to expose the welding part;

inserting a welding terminal of a flexible printed circuit board into the concave part, and welding the welding terminal of the flexible printed circuit board onto the welding part.

(16) The manufacturing method according to (15), wherein, before the forming a peripheral wiring structure and an organic electroluminescent structure on a base substrate, packaging and assembling a packaging structure and the base substrate, wherein the peripheral wiring structure has a welding part, the method further comprises:

coating a PI liquid on a glass substrate;

baking the glass substrate coated with the PI liquid to form a base substrate.

(17) The manufacturing method according to (15) or (16), wherein, before the forming a concave part which is opened on a surface of the base substrate away from the organic electroluminescent structure to expose the welding part, the method further comprises:

separating a structure from the glass substrate, the structure is obtained by forming the peripheral wiring structure and the organic electroluminescent structure on the base substrate, and packaging and assembling the packaging structure and the base substrate.

Although the disclosure has been described above in great detail by using general descriptions and specific embodiments, on the basis of the disclosure, various changes and improvements can be made to the disclosure, which is apparent to those skilled in the art. Therefore, all such changes and improvements without departing from the spirit of the disclosure are within the scope of the claims of the disclosure.

The present application claims priority of Chinese Patent Application No. 201410708765.0 filed on Nov. 27, 2014, the disclosure of which is incorporated herein by reference in its entirety as part of the present application.

The invention claimed is:

1. An organic electroluminescent device, comprising a base substrate, a packaging structure, an organic electroluminescent structure located between the base substrate and the packaging structure, and a flexible printed circuit board; the base substrate being provided with a peripheral wiring structure electrically connected with an internal wiring of the organic electroluminescent structure; the peripheral wiring structure including a welding part, wherein the welding part has a first surface facing the base substrate, at least a portion of the first surface being exposed to electrically connect with a welding terminal of the flexible printed circuit board.

2. The organic electroluminescent device according to claim 1, wherein, the base substrate is provided with a concave part configured to expose the at least a portion of the first surface of the welding part.

3. The organic electroluminescent device according to claim 1, wherein, the peripheral wiring structure further includes a peripheral wiring electrically connected with the internal wiring of the organic electroluminescent structure, and a diffusion circuit wiring for connecting the welding part and the peripheral wiring; the peripheral wiring structure is divided into a first wiring layer and a second wiring layer, the first wiring layer is located between the second wiring layer and the base substrate; and the welding part is arranged in the first wiring layer.

4. The organic electroluminescent device according to claim 1, wherein, the diffusion circuit wiring and at least a portion of the peripheral wiring are arranged in the first wiring layer, a contact part is arranged in the second wiring layer, the peripheral wiring structure arranged in the first wiring layer and the peripheral wiring structure arranged in the second wiring layer are electrically connected through the contact part.

5. The organic electroluminescent device according to claim 4, the contact part arranged in the second wiring layer includes a contact part which is electrically connected with at least a portion of the peripheral wiring arranged in the first wiring layer and the internal wiring of the organic electroluminescent structure.

6. The organic electroluminescent device according to claim 3, wherein, an insulating layer is arranged between the first wiring layer and the second wiring layer, the insulating layer is provided with a via hole region corresponding to the contact part in the second wiring layer, a portion of the peripheral wiring structure arranged in the first wiring layer and corresponding to the contact part passes through the insulating layer through the via hole region so as to be electrically connected with the contact part.

7. The organic electroluminescent device according to claim 3, wherein, the welding part is located in middle of the first wiring layer.

8. The organic electroluminescent device according to claim 1, wherein, the peripheral wiring structure further includes a peripheral wiring electrically connected with the internal wiring of the organic electroluminescent structure, and a diffusion circuit wiring for connecting the welding part and the peripheral wiring, the peripheral wiring structure is divided into a third wiring layer, a fourth wiring layer and a fifth wiring layer, which are sequentially arranged in a direction from the base substrate to the organic electroluminescent structure, wherein, the welding part is arranged in the third wiring layer;
the diffusion circuit wiring and the peripheral wiring are arranged in the fourth wiring layer, and the fourth wiring layer is provided with a contact part electrically connected with the third wiring layer;
the fifth wiring layer is provided with a contact part which is electrically connected with the peripheral wiring and the internal wiring of the organic electroluminescent structure.

9. The organic electroluminescent device according to claim 8, wherein, an insulating layer is arranged between the third wiring layer and the fourth wiring layer, a portion of the peripheral wiring structure arranged in the third wiring layer and corresponding to the contact part in the fourth wiring layer passes the insulating layer so as to be electrically connected with the contact part arranged in the fourth wiring layer;

an insulating layer is arranged between the fourth wiring layer and the fifth wiring layer, a portion of the peripheral wiring structure arranged in the fourth wiring layer and corresponding to the contact part in the fifth wiring layer passes the insulating layer so as to be electrically connected with the contact part arranged in the fifth wiring layer.

10. The organic electroluminescent device according to claim 8, wherein, the welding part is located in middle of the third wiring layer.

11. The organic electroluminescent device according to claim 1, wherein, the base substrate is a flexible base substrate and the packaging structure is a flexible packaging structure.

12. The organic electroluminescent device according to claim 11, wherein, the base substrate is a PI film.

13. The organic electroluminescent device according to claim 11, wherein, the packaging structure is a packaging film formed by organic thin films and inorganic thin films alternatively overlapping with each other.

14. A display device, comprising the organic electroluminescent device according to claim 1.

15. A manufacturing method of the organic electroluminescent device according to claim 1, comprising:

forming a peripheral wiring structure and an organic electroluminescent structure on a base substrate, packaging and assembling a packaging structure and the base substrate, wherein the peripheral wiring structure has a welding part;

forming a concave part which is opened on a surface of the base substrate away from the organic electroluminescent structure to expose the welding part;

inserting a welding terminal of a flexible printed circuit board into the concave part, and welding the welding terminal of the flexible printed circuit board onto the welding part.

16. The manufacturing method according to claim 15, wherein, before the forming a peripheral wiring structure and an organic electroluminescent structure on a base substrate, packaging and assembling a packaging structure and the base substrate, wherein the peripheral wiring structure has a welding part, the method further comprises:

coating a PI liquid on a glass substrate;
baking the glass substrate coated with the PI liquid to form a base substrate.

17. The manufacturing method according to claim 16, wherein, before the forming a concave part which is opened on a surface of the base substrate away from the organic electroluminescent structure to expose the welding part, the method further comprises:

separating a structure from the glass substrate, the structure is obtained by forming the peripheral wiring structure and the organic electroluminescent structure on the base substrate, and packaging and assembling the packaging structure and the base substrate.

* * * * *